(12) United States Patent
Yamamoto

(10) Patent No.: US 7,510,608 B2
(45) Date of Patent: Mar. 31, 2009

(54) HARD COATING FILM

(75) Inventor: Kenji Yamamoto, Kobe (JP)

(73) Assignee: Kobe Steel Ltd., Kobe-shi (JP)

( * ) Notice: Subject to any disclaimer, the term of this patent is extended or adjusted under 35 U.S.C. 154(b) by 154 days.

(21) Appl. No.: 11/466,671

(22) Filed: Aug. 23, 2006

(65) Prior Publication Data

US 2007/0172694 A1 Jul. 26, 2007

(30) Foreign Application Priority Data

Jan. 20, 2006 (JP) .............................. 2006-012092

(51) Int. Cl.
*B32B 9/00* (2006.01)
*C23C 14/06* (2006.01)

(52) U.S. Cl. .............................. 106/287.17; 204/192.1; 204/192.11; 427/249.1; 427/249.5; 427/255.22; 427/255.28; 427/255.394

(58) Field of Classification Search ............ 106/287.17; 204/192.1, 192.11; 427/249.1, 249.5, 255.22, 427/255.28, 255.394
See application file for complete search history.

(56) References Cited

U.S. PATENT DOCUMENTS

| | | | | | |
|---|---|---|---|---|---|
| 5,981,078 | A | * | 11/1999 | Tabersky et al. ............ | 428/697 |
| 7,144,547 | B2 | * | 12/2006 | Yamamoto et al. ............ | 419/48 |
| 7,226,670 | B2 | * | 6/2007 | Derflinger et al. ........... | 428/697 |
| 2004/0115484 | A1 | | 6/2004 | Horling et al. | |

FOREIGN PATENT DOCUMENTS

| | | |
|---|---|---|
| EP | 1 219 723 A2 | 7/2002 |
| EP | 1 348 776 A1 | 10/2003 |
| EP | 0 999 290 B1 | 3/2005 |
| JP | 6-330348 | 11/1994 |
| JP | 9-41127 | 2/1997 |
| JP | 10-18024 | 1/1998 |
| JP | 10-25566 | 1/1998 |
| JP | 2003-71610 | 3/2003 |
| JP | 2004-268250 | 9/2004 |
| JP | 2005-8920 | 1/2005 |
| WO | WO 2004/059030 A2 | 7/2004 |
| WO | WO 2006/005217 A2 | 1/2006 |

OTHER PUBLICATIONS

U.S. Appl. No. 11/428,491, filed Jul. 3, 2006, Yamamoto et al.

(Continued)

*Primary Examiner*—Archene Turner
(74) *Attorney, Agent, or Firm*—Oblon, Spivak, McClelland, Maier & Neustadt, P.C.

(57) ABSTRACT

Disclosed herein is a hard coating film of laminate type which comprises more than one layer of a first kind, which has a composition represented by the formula (1a) below and a thickness of 1 to 80 nm, and more than one layer of a second kind, which has a composition represented by the formula (2a) below and a thickness of 1 to 80 nm, the layers being placed alternately one over another.

$$(Cr_{(1-a)}Al_a)(C_{(1-x)}N_x) \quad (1a)$$

$$(Zr_{(1-k)}Hf_k)(C_{(1-y)}N_y) \quad (2a)$$

where each subscript denotes the atomic ratio specified below.

$0.2 \leq a \leq 0.8$ $0.7 \leq x \leq 1$ $0 \leq k \leq 1$ $0.5 \leq y \leq 1$

The hard coating film has outstanding high-temperature characteristics.

20 Claims, 2 Drawing Sheets

OTHER PUBLICATIONS

Ayako Kimura, et al., "Anisotropic lattice expansion and shrinkage of hexagonal TiAlN and CrAlN films", Surface and Coatings Technology 169-170, 2003, pp. 367-370.

Masahiro Kawate, et al., "Oxidation resistance of $Cr_{1-x}Al_xN$ and $Ti_{1-x}Al_xN$ films", Surface and Coatings Technology 165, 2003, pp. 163-167.

M. Uchida, et al., "Friction and wear properties of CrAlN and CrVN films deposited by cathodic arc ion plating method", Surface and Coatings Technology 177-178, 2004, pp. 627-630.

U.S. Appl. No. 11/536,201, filed Sep. 28, 2006, Yamamoto et al.

U.S. Appl. No. 11/774,990, filed Jul. 9, 2007, Yamamoto et al.

* cited by examiner

HARD COATING FILM

BACKGROUND OF THE INVENTION

1. Field of the Invention

The present invention relates to a hard coating film that can be advantageously formed on cutting tools (such as tip, drill, and end mill) and jigs (such as forging die and punching die).

2. Description of the Related Art

Conventional cutting tools intended for improved wear resistance consists of a substrate of high speed steel, cemented carbide, cermet, or the like and a hard coating film of TiN, TiCN, TiAlN, and the like formed thereon. Of these hard coating films, that of TiAlN is favorably applied to cutting tools for high speed cutting or hard materials such as hardened steel on account of its very high wear resistance. The recent trend to harder works and higher cutting speed necessitate the development of a new hard coating film with better wear resistance.

An example of recent developments is modification of TiAlN into TiCrAlN (by partial substitution of Ti with Cr) as disclosed in Patent Document 1. According to the disclosure, added Cr increases the compositional ratio of AlN of rock salt structure, thereby contributing to the hardness and oxidation resistance of the coating film. Another example of recent developments is a hard coating film of CrAlN resulting from TiAlN by entire replacement of Ti with Cr, as disclosed in Patent Document 2.

Patent Document 1:
Japanese Patent Laid-open No. 2003-71610 (Claim, Paragraphs 0022 and 0023)

Patent Document 2:
Japanese Patent Laid-open No. Hei-9-41127 (Claims)

OBJECT AND SUMMARY OF THE INVENTION

Although the above-mentioned hard coating films of TiAlN, TiCrAlN, and AlCrN exhibit good oxidation resistance at high temperatures, they are liable to decrease in hardness under harsh conditions involving extremely high temperatures or intense sliding friction (which result from high speed cutting in a dry state or plastic working with a high areal pressure). In some cases, they undergo the change of crystal structure for transition into the soft phase. Therefore, they have room for improvement in high-temperature characteristics.

The present invention was completed in view of the foregoing. It is an object of the present invention to provide a hard coating film with improved high-temperature characteristics.

In order to address the above-mentioned problems, the present inventors carried out a series of researches which led to the finding that the above-mentioned object is achieved if a nitride (CrAlN) or carbonitride (CrAlCN) of CrAl is properly combined with Zr or Hf. The present invention is based on this finding.

The present invention is directed to a hard coating film of laminate type which comprises more than one layer of a first kind, which has a composition represented by the formula (1a) below and a thickness of 1 to 80 nm, and more than one layer of a second kind, which has a composition represented by the formula (2a) below and a thickness of 1 to 80 nm, the layers being placed alternately one over another.

$$(Cr_{(1-a)}Al_a)(C_{(1-x)}N_x) \quad (1a)$$

$$(Zr_{(1-k)}Hf_k)(C_{(1-y)}N_y) \quad (2a)$$

where each subscript denotes the atomic ratio specified below.

$$0.2 \leq a \leq 0.8$$

$$0.7 \leq x \leq 1$$

$$0 \leq k \leq 1$$

$$0.5 \leq y \leq 1$$

In one embodiment, the layers of a first kind are replaced at least partly by layers having a composition represented by the formula (1b) below and a thickness of 1 to 80 nm, or the layers of a second kind are replaced at least partly by layers having a composition represented by the formula (2b) below and a thickness of 1 to 80 nm.

$$(Cr_{(1-a-b-c)}Al_aSi_bB_c)(C_{(1-x)}N_x) \quad (1b)$$

where each subscript denotes the atomic ratio specified below, with either of b and c possibly being 0.

$$0.2 \leq a \leq 0.8$$

$$0 < (b+c) \leq 0.2$$

$$0.7 \leq x \leq 1$$

$$(Zr_{(1-k-m-n)}Hf_kSi_mB_n)(C_{(1-y)}N_y) \quad (2b)$$

where each subscript denotes the atomic ratio specified below, with either of m and n possibly being 0.

$$0 \leq k \leq 1-m-n$$

$$0 < (m+n) \leq 0.2$$

$$0.5 \leq y \leq 1$$

The hard coating film of laminate type mentioned above is obtained by repeating alternately several times a first step of forming a layer of nitride or carbonitride (C/N atomic ratio being from 0.3/0.7 to 0/1), 1 to 80 nm in thickness, by ion-plating or sputtering with a target rep-resented by the formula (1c) or (1d) below and a second step of forming a layer of nitride or carbonitride (C/N atomic ratio being from 0.5/0.5 to 0/1), 1 to 80 nm in thickness, by ion-plating or sputtering with a target represented by the formula (2c) or (2d) below.

$$(Cr_{(1-a)}Al_a) \quad (1c)$$

$$(Cr_{(1-a-b-c)}Al_aSi_bB_c) \quad (1d)$$

$$(Zr_{(1-k)}Hf_k) \quad (2c)$$

$$(Zr_{(1-k-m-n)}Hf_kSi_mB_n) \quad (2d)$$

where each subscript denotes the atomic ratio specified below, with either of b and c possibly being 0 and either of m and n possibly being 0.

$$0.2 \leq a \leq 0.8$$

$$0 < (b+c) \leq 0.2$$

$$0 \leq k \leq 1 \text{ (for the formula 2c) or}$$

$$0 \leq k \leq 1-m-n \text{ (for the formula 2d)}$$

$$0 < (m+n) \leq 0.2$$

At least either (particularly both) of the layer of a first kind and the layer of a second kind should preferably possess the cubic crystal structure.

The hard coating film according to the present invention is not restricted to that of laminate type; it may be a hard coating film which has a composition represented by the formula (3a) or (3b) below.

$$(Cr_{(1-p-q-r)}Al_pZr_qHf_r)(C_{(1-z)}N_z) \qquad (3a)$$

where each subscript denotes the atomic ratio specified below, with either of q and r possibly being 0.

when p<0.5:

$0.2 \leq p < 0.5$ $0.2 \leq (q+r) \leq 0.5$ $0.05 \leq (1-p-q-r)$ $0.5 \leq z \leq 1$ when $p \geq 0.5$:

$0.5 \leq p \leq 0.7$ $0.05 \leq (q+r) \leq 0.25$ $0.15 \leq (1-p-q-r)$ $0.5 \leq z \leq 1$ $$(Cr_{(1-p-q-r-s-t)}Al_pZr_qHf_rSi_sB_t)(C_{(1-z)}N_z) \qquad (3b)$$

where each subscript denotes the atomic ratio specified below, with either of q and r possibly being 0 and either of s and t possibly being 0.

when p<0.5:

$0.2 \leq p < 0.5$ $0.2 \leq (q+r) \leq 0.5$ $0 < (s+t) \leq 0.2$ $0.05 \leq (1-p-q-r-s-t)$ $0.5 \leq z \leq 1$ when $p \geq 0.5$ $0.5 \leq p \leq 0.7$ $0.05 \leq (q+r) \leq 0.25$ $0 < (s+t) \leq 0.2$ $0.15 \leq (1-p-q-r-s-t)$ $0.5 \leq z \leq 1$ The hard coating film mentioned above is obtained by forming a layer of nitride or carbonitride (C/N atomic ratio being from 0.5/0.5 to 0/1) by ion-plating or sputtering with a target represented by the formula (3c) or (3b) below.

$$(Cr_{(1-p-q-r)}Al_pZr_qHf_r) \qquad (3c)$$

where each subscript denotes the atomic ratio specified below, with either of q and r possibly being 0.

when p<0.5:

$0.2 \leq p \leq 0.5$ $0.2 \leq (q+r) \leq 0.5$ $0.05 \leq (1-p-q-r)$ when $p \geq 0.5$:

$0.5 \leq p \leq 0.7$ $0.05 \leq (q+r) \leq 0.25$ $0.15 \leq (1-p-q-r)$ $$(Cr_{(1-p-q-r-s-t)}Al_pZr_qHf_rSi_sB_t) \qquad (3d)$$

where each subscript denotes the atomic ratio specified below, with either of q and r possibly being 0 and either of s and t possibly being 0.

when p<0.5:

$0.2 \leq p \leq 0.5$ $0.2 \leq (q+r) \leq 0.5$ $0 < (s+t) \leq 0.2$ $0.05 \leq (1-p-q-r-s-t)$ when $p \geq 0.5$:

$0.5 \leq p \leq 0.7$ $0.05 \leq (q+r) \leq 0.25$ $0 < (s+t) \leq 0.2$ $0.15 \leq (1-p-q-r-s-t)$ The hard coating film mentioned above should preferably possess the cubic crystal structure.

The hard coating film according to the present invention has a thickness no smaller than 1000 nm regardless of whether it is of laminate type or not.

EFFECT OF THE INVENTION

The hard coating film according to the present invention has improved high-temperature characteristics because it is made from CrAl in its nitride (CrAlN) or carbonitride (CrAlCN) form properly combined with Zr and/or Hf. The nitride and carbonitride will be collectively referred to as (carbo)nitride hereinafter.

Figure 1:
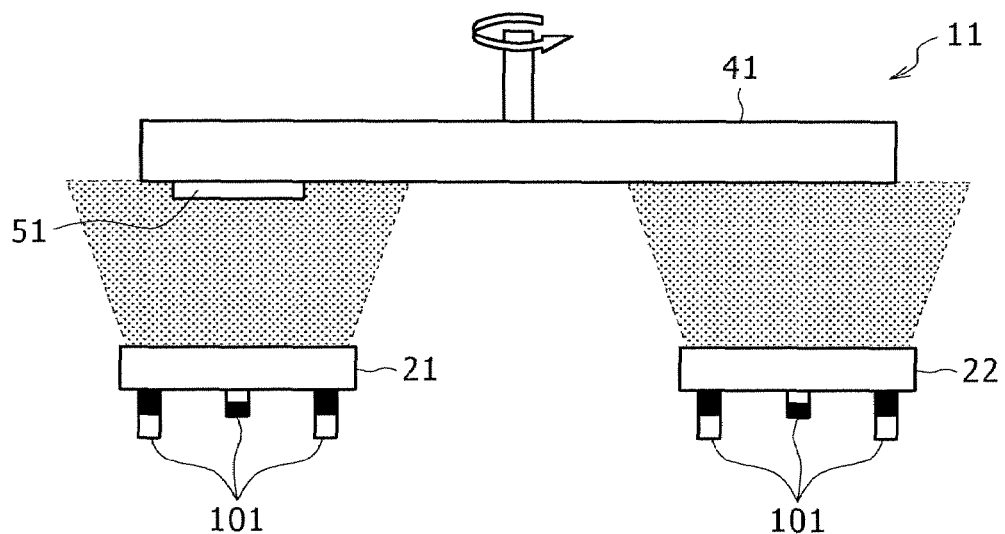
FIG. 1 is a schematic diagram showing an example of the apparatus for fabricating the hard coating film according to the present invention.

The hard coating film according to the present invention is formed from a (carbo)nitride of CrAl properly combined with Zr and/or Hf. The first embodiment is designed for a hard coating film of laminate type consisting of thin layers of a (carbo)nitride of CrAl and a (carbo)nitride of Zr and/or Hr. The second embodiment is designed for a hard coating film of single-layer type formed from a (carbo)-nitride of CrAl combined with Zr and/or Hf. (This hard coating film will be referred to as a single-layered hard coating film hereinafter. The (carbo)nitride from which the single-layered hard coating film is formed will be referred to as CrAlZrHf (carbo) nitride hereinafter.) (Carbo)nitrides of Zr and Hf have a larger negative free energy of formation than (carbo)nitrides of Ti and Cr. Therefore, a (carbo)nitride of CrAl is improved in high-temperature stability, high-temperature hardness, and wear resistance when it is laminated with or incorporated with a (carbo)nitride of Zr or Hf.

Incidentally, the (carbo)nitride of CrAl, the (carbo)-nitride nitride of Zr and/or Hf, and the (carbo)nitride of CrAlZrHf may also be incorporated with Si and/or B. The thus added Si and B further improve the hard coating film in oxidation resistance and contribute to the formation of fine crystal grains in the hard coating film.

The following is a detailed description of the hard coating film according to the present invention.

<Hard Coating Film of Laminate Type>

The hard coating film of laminate type according to the present invention consists of more than one layer of a first kind formed from a (carbo)nitride of CrAl represented by the formula (1a) below and more than one layer of a second kind formed from a (carbo)nitride of Zr and/or Hf represented by the formula (2a) below, the layers being placed alternately one over another.

$$(Cr_{(1-a)}Al_a)(C_{(1-x)}N_x) \quad (1a)$$

$$(Zr_{(1-k)}Hf_k)(C_{(1-y)}N_y) \quad (2a)$$

where each subscript denotes the atomic ratio specified below.

$0.2 \leq a \leq 0.8$ $0.7 \leq x \leq 1$ $0 \leq k \leq 1$ $0.5 \leq y \leq 1$

The layer of a first kind is formed from a (carbo)-nitride of CrAl represented by the formula (1a). Al in this compound contributes to oxidation resistance and hardness. The atomic ratio (a) of Al in the formula (1a) should be no smaller than 0.2, preferably no smaller than 0.3, more preferably no smaller than 0.4. Usually, an increasing atomic ratio of Al is responsible for improved oxidation resistance. However, Al in an excess amount changes the crystal structure of the hard coating film from cubic to hexagonal. The cubic structure (or rock salt structure or NaCl structure) leads to the high hardness phase. (It will be referred to as B1 structure hereinafter.) The hexagonal structure (or wurtzite structure or ZnS structure) leads to the comparatively low hardness phase. (It will be referred to as B4 structure hereinafter.) Therefore, the atomic ratio (a) of Al should be no larger than 0.8, preferably no larger than 0.7.

The atomic ratio (x) of N in the formula (1a) for the layer of a first kind should be no smaller than 0.7, preferably no smaller than 0.8, more preferably no smaller than 0.9. A decrease in the atomic ratio (x) of N leads to an increase in the atomic ratio of C, resulting in an unstable compound of $AlC_3$.

The composition represented by the formula (2a) for the layer of a second kind may contain (carbo)nitrides of Zr and/or Hf in any atomic ratio because Zr and Hf have mutually similar properties. In other words, the atomic ratio (k) of Hf in the formula 2a may take any value from 0 to 1, preferably 0.1 to 0.8, more preferably 0.2 to 0.5.

The composition for the layer of a second kind contains C which forms high-hardness compounds such as ZrC and HfC, thereby making the coating film hard. However, with an excessively large atomic ratio (1-y) of C, the resulting coating film will be poor in oxidation resistance. In this specification, the atomic ratio (1-y) of C is indirectly specified by the atomic ratio (y) of N. The atomic ratio (y) of N should be from 0.5 to 1, preferably from 0.6 to 1.

The layer of a first kind should have a thickness of about 1 to 80 nm. In order for it to contribute to hardness, it should have an adequate thickness no smaller than 5 nm, particularly no smaller than 20 nm. When it is excessively thick, the layer of a second kind will be too thin to contribute to the high temperature stability of the hard coating film. Therefore, it should have a thickness no smaller than 80 nm, preferably no smaller than 70 nm, more preferably no smaller than 60 nm.

The layer of a second kind should have a thickness of about 1 to 80 nm. It is characterized by its thermodynamic stability, and it stabilizes the layer of a first kind which easily changes in crystal structure at high temperatures. It decreases in this stabilizing effect if it has an excessively small thickness. A desired thickness is no smaller than 2 nm, particularly no smaller than 10 nm. The hard coating film will decrease in hardness if the layer of a second kind has an excessively large thickness because it is less hard than the layer of a first kind. Therefore, a desired thickness is no larger than 50 nm, particularly no larger than 35 nm.

The layer of a first kind and the layer of a second kind may have a thickness of $T_1$ and a thickness of $T_2$, respectively, such that the difference between $T_1$ and $T_2$ is smaller than 0, preferably no smaller than 0, more preferably about 5 to 50, particularly about 10 to 40. If the layer of a first kind is thicker than the layer of a second kind (that is, the difference $(T_1-T_2)$ is no smaller than 0), the resulting hard coating film will have improved hardness because the former (which is harder than the latter) accounts for a larger portion.

The hard coating film consists of more than one layer of a first kind and more than one layer of a second kind, the layers being placed alternately one over another as many times as steps of lamination. The layers of a first kind may be replaced at least partly (entirely in particular) by layers additionally containing Si and/or B. The layer of a first kind additionally containing Si and/or B is identical with the ordinary layer of a first kind represented by the formula (1a), except that it is represented by the formula (1b) below (in which B may combine with the carbonitride or form borides with Cr, Al, and Si).

$$(Cr_{(1-a-b-c)}Al_aSi_bB_c)(C_{(1-x)}N_x) \quad (1b)$$

where each subscript denotes the atomic ratio specified below, with either of b and c possibly being 0, and a being defined as in the formula (1a).

$0 < (b+c) \leq 0.2$

The additional Si and/or B form the Si—N bond or B—N bond at the grain boundary, thereby suppressing crystal growth and giving rise to fine crystals, which leads to improved hardness. They also contribute to oxidation resistance (although not yet elucidated). An adequate amount of (b+c) should be no less than 0.02, preferably no less than 0.05. An excess amount of Si and/or B allows hexagonal crystals to dominate. The upper limit of the amount of (b+c) should be 0.2, preferably 0.15, more preferably 0.1.

Either or both of Si and B may be added. Therefore, either of the subscripts b and c may be 0. Since Si is superior to B in oxidation resistance, it is desirable to add Si more than B if oxidation resistance is important (or it is more desirable to add Si only). On the other hand, since B forms the B—N bond for lubrication, it is desirable to add B more than Si if lubricity is important (or it is more desirable to add B only).

The layers of a second kind may be replaced at least partly (entirely in particular) by layers additionally containing Si and/or B. The layer of a second kind additionally containing Si and/or B is identical with the ordinary layer of a second kind represented by the formula (2a), except that it is represented by the formula (2b) below (in which B may combine with the carbonitride or form borides with Zr, Hf, and Si).

$$(Zr_{(1-k-m-n)}Hf_kSi_mB_n)(C_{(1-y)}N_y) \quad (2b)$$

where each subscript denotes the atomic ratio specified below, with either of m and n possibly being 0.

$$0 \leq k \leq l-m-n$$

$$0<(m+n)\leq 0.2$$

The range of "m+n" is specified for the same reason as the range of "b+c" mentioned above. Either of m and n may be 0 for the same reason as mentioned above for b and c. The desired range of K is the same as that in the formula 2a.

Either or both of the layer of a first kind and the layer of a second kind may be replaced by the layer containing Si and/or B mentioned above.

It is desirable that at least either (preferably both) of the layer of a first kind and the layer of a second kind (both of them may contain Si and/or B) exhibit the cubic crystal structure, which is harder than the hexagonal crystal structure.

The hard coating film of laminate type mentioned above is obtained by repeating alternately several times a first step of forming the layer of a first kind (which may or may not contain Si and/or B) and a second step of forming the layer of a second kind (which may or may not contain Si and/or B). The first and second steps may be accomplished by any known method such as physical vapor deposition (PVD) and chemical vapor deposition (CVD). PVD (including sputtering, ion plating, electron beam deposition, and hollow cathode deposition) is desirable for good layer adhesion.

The first and second steps by PVD employ specific targets to form the layers of a first kind and a second kind. Each target contains elements that constitute the layers. For example, the first step employs the target having a composition represented by the formula (1c) or (1d) below to form the layer of (carbo)nitride having the C/N atomic ratio of from 0.3/0.7 to 0/1 and having a thickness of 1 to 80 nm. The second step employs the target having a composition represented by the formula (2c) or (2d) below to form the layer of (carbo)nitride having the C/N atomic ratio of from 0.5/0.5 to 0/1 and having a thickness of 1 to 80 nm.

$$(Cr_{(1-a)}Al_a) \quad (1c)$$

$$(Cr_{(1-a-b-c)}Al_aSi_bB_c) \quad (1d)$$

$$(Zr_{(1-k)}Hf_k) \quad (2c)$$

$$(Zr_{(1-k-m-n)}Hf_kSi_mB_n) \quad (2d)$$

where each subscript denotes the atomic ratio as specified above for the formulas (1a), (1b), (2a), and (2b) above.

Preferred film-forming methods are sputtering and ion plating, in which the rate of evaporation of elements in the target does not greatly depend on their melting point. Film forming by electron beam deposition and hollow cathode deposition present difficulties in controlling the amount of evaporation of each element in the target.

Ion plating (particularly arc ion plating) excels sputtering (particularly unbalance magnetron sputtering (UBMS)) in film forming rate. However, sputtering is superior to ion plating in easy discharging, easy thickness control, and infrequent target breakage. These characteristics may be used to select an adequate film forming method. For example, sputtering is suitable for deposition that employs a target containing Zr and/or Hf because ion plating presents difficulties with discharging. Except for the foregoing, ion plating is recommended for better fabrication efficiency.

The method for forming the hard coating film of laminate type by sputtering (particularly UBMS) or ion plating (particularly arc ion plating) will be described in more detail with reference to the accompanying drawings.

FIG. 1 is a schematic diagram showing an example of the apparatus for fabricating the hard coating film according to the present invention. The apparatus 11 shown in FIG. 1 has two mutually different evaporation sources 21 and 22 (for sputtering) positioned in the same direction. The evaporation sources 21 and 22 each have the magnetic field generating mechanism 101 behind them, so that they form the film in their front side. There is a rotary table 41 in front of the evaporation sources 21 and 22. Onto the rotary table 41 is attached a substrate 51. The first evaporation source 21 is the target (1c) or (1d) mentioned above, and the second evaporation source 22 is the target (2c) or (2d). These targets are allowed to evaporate in a film-forming gas, which includes an N-containing gas (such as nitrogen), a mixture of N-containing gas and C-containing gas (such as methane), and the foregoing gas diluted with an inert gas (such as argon). As the rotary table 41 turns, the substrate 51 faces alternately the first evaporation source 21 and the second evaporation source 22. In this way the layer of a first kind and the layer of a second kind are alternately formed one over another on the substrate 51. Thus there is obtained the hard coating film.

Figure 2:
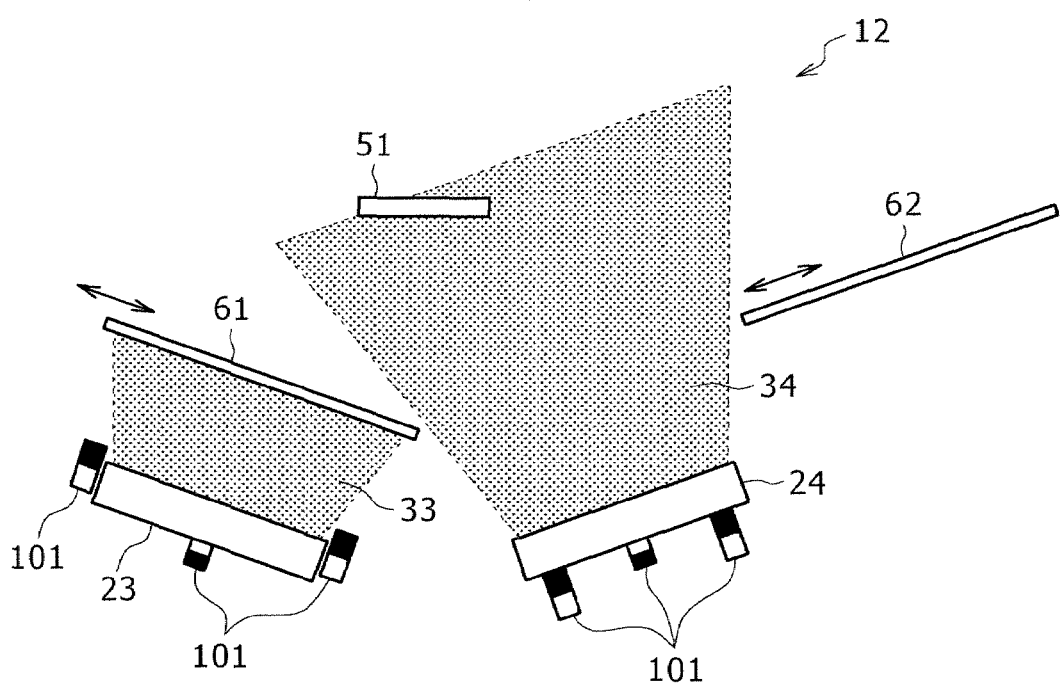
FIG. 2 is a schematic diagram showing another example of the apparatus for fabricating the hard coating film according to the present invention.

FIG. 2 is a schematic diagram showing another example of the apparatus for fabricating the hard coating film according to the present invention. The apparatus 12 shown in FIG. 2 has two mutually different evaporation sources 23 (arc type) and 24 (sputtering type) facing the substrate 51. The evaporation sources 23 and 24 are separated from the substrate 51 by the shutters 61 and 62 placed between them. The shutters 61 and 62 shut out the vapors 33 and 34 from the evaporation sources 23 and 24. One evaporation source is the target (1c) or (1d) mentioned above, and the other evaporation source is the target (2c) or (2d) mentioned above. These targets are allowed to evaporate in a film-forming gas, which includes an N-containing gas, a mixture of N-containing gas and C-containing gas, and the foregoing gas diluted with an inert gas. During evaporation, the shutters 61 and 62 are opened and closed alternately. In this way the layer of a first kind and the layer of a second kind are alternately formed one over another on the substrate 51. Thus there is obtained the hard coating film.

The same function as shutter opening and closing may be accomplished by turning on and off the discharging of the evaporation sources to fabricate the hard coating film.

The apparatuses 11 and 12 shown in FIGS. 1 and 2 may have two or more evaporation sources. In such a case, both of the targets (1c) and (1d) may be used as the evaporation sources for the layer of a first kind, and the targets (2c) and (2d) may be used as the evaporation sources for the layer of a second kind.

Also, the apparatuses 11 and 12 shown in FIGS. 1 and 2 may have either sputtering sources or arc sources as the evaporation sources. In a preferred embodiment, the targets (1c) and (2c) should be discharged by arc ion plating, and the targets (1d) and (2d) should be discharged by sputtering.

Incidentally, the apparatuses shown in FIGS. 1 and 2 permit film forming on a flat substrate but involves difficulties in film forming on a rod-like substrate. Their ability depends on the shape of the substrate. The apparatus shown in FIG. 2 suffers from low film forming efficiency because one evaporation source remains idle while the other evaporation source is in use. Therefore, it is recommended to use the apparatus shown in FIG. 3 to overcome such disadvantages.

Figure 3:
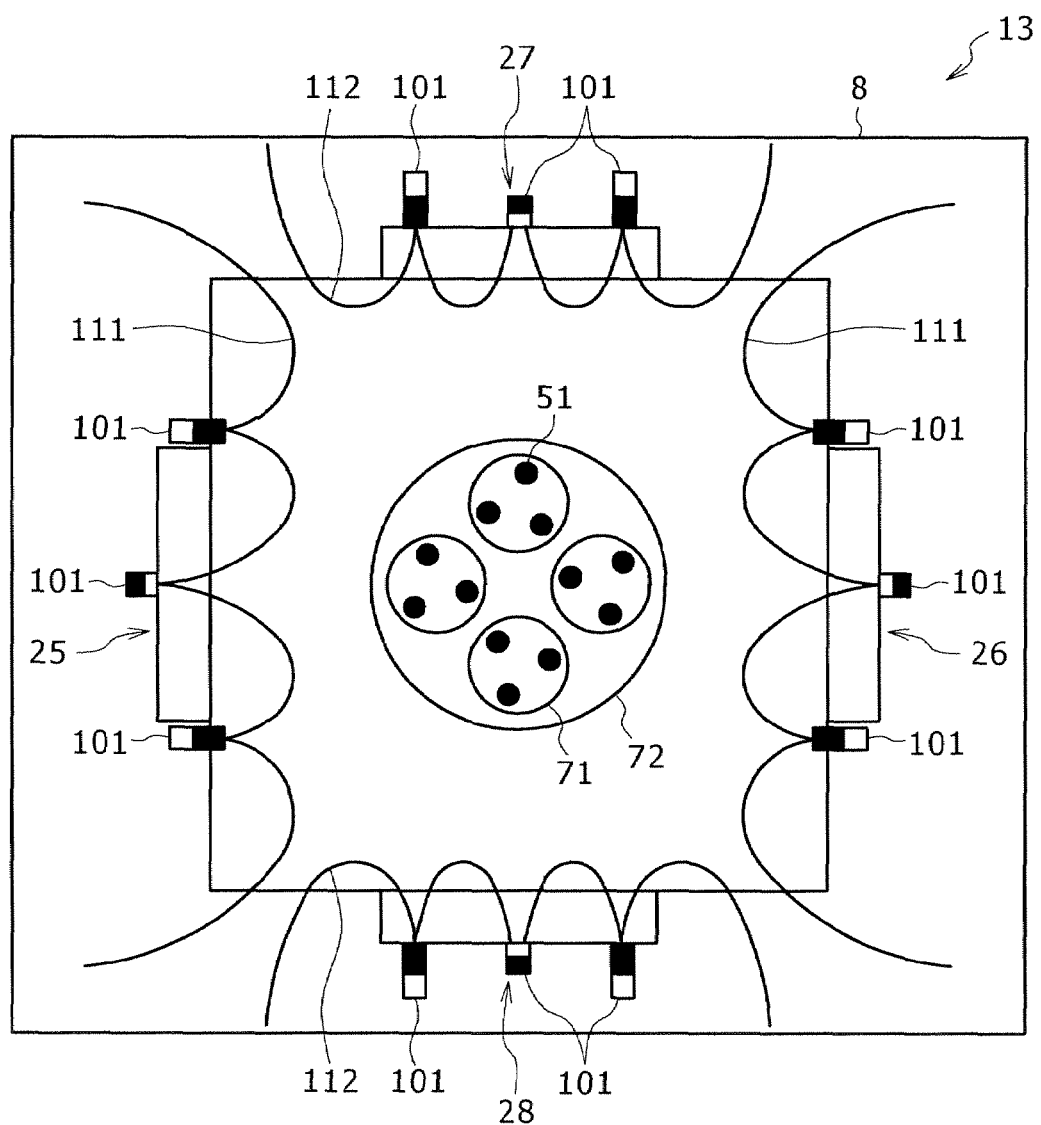
FIG. 3 is a schematic diagram showing further another example of the apparatus for fabricating the hard coating film according to the present invention.

The apparatus 13 shown in FIG. 3 consists of a vacuum chamber 8 and a rotary plate 72 placed therein. The rotary plate 72 has four rotary tables 71 which are symmetrically arranged. On each rotary table 71 are mounted substrates 51. Around the rotary plate 72 are arranged the first evaporation sources 25 and 26 (of arc type) and the second evaporation sources 27 and 28 (of sputtering type). These evaporation sources are arranged such that the first pair and the second pair adjoin alternately.

One set of the evaporation sources consists of the targets (1c) and/or (1d) and the other set of the evaporation sources consists of the targets (2c) and/or (2d). These targets are allowed to evaporate in a film-forming gas, which includes an N-containing gas, a mixture of N-containing gas and C-containing gas, and the foregoing gas diluted with an inert gas. As the rotary plate 72 and the rotary tables 71 turn, the substrate 51 faces alternately the first set of evaporation sources 25 and 26 and the second set of evaporation sources 27 and 28. In this way the layer of a first kind and the layer of a second kind are alternately formed one over another on the substrate 51. Thus there is obtained the hard coating film. The apparatus shown in FIG. 3 is very efficient because all the evaporation sources work at all times. The thickness of individual layers can be controlled by adjusting the rotating speed of the substrate and the power supplied to the evaporation sources.

The apparatus shown in FIG. 3 has the magnetic field generator 101 which separates the magnetic field of the arc evaporation sources 25 and 26 and the magnetic field 112 of the sputtering evaporation sources 27 and 28 from each other. There may be a situation in which the magnetic fields 111 and 112 join together. In the case where the magnetic fields 111 and 112 do not join each other, those electrons released from the evaporation sources 25, 26, 27, and 28 are introduced not only to the substrate 51 but also to the chamber 8 which functions as the anode. By contrast, in the case where the magnetic fields 111 and 112 join together, the magnetic field (or magnetic flux) in the chamber 8 is closed and those electrons released from the evaporation sources 25, 26, 27, and 28 are trapped in the closed magnetic field. This leads to efficient film forming and improved film properties because of increased directivity.

The apparatus shown in FIG. 3 (or FIG. 1) is of a rotary type; however, it may be of any type so long as it permits the substrate 51 to pass the front of the evaporation source. A possible example may be such that the evaporation sources are linearly arranged and the substrate reciprocates in front of them.

<Hard Coating Film of Single-Layer Type>

The hard coating film according to the present invention is not limited to that of laminate type mentioned above. A hard coating film of single-layer type fabricates the same effect as a hard coating film of laminate type if it is formed from a (carbo)nitride of CrAlZrHf (which is obtained by addition of Zr and/or Hf to a (carbo)nitride of CrAl). To be concrete, the hard coating film of single-layer type has a composition represented by the formula (3a) below.

$$(Cr_{(1-p-q-r)}Al_pZr_qHf_r)(C_{(1-z)}N_z) \quad (3a)$$

where each subscript denotes the atomic ratio specified below, with either of q and r possibly being 0.

when p<0.5:

$0.2 \leq p < 0.5$ $0.2 \leq (q+r) \leq 0.5$ $0.05 \leq (1-p-q-r)$ $0.5 \leq z \leq 1$ when p≧0.5:

$0.5 \leq p \leq 0.7$ $0.05 \leq (q+r) \leq 0.25$ $0.15 \leq (1-p-q-r)$ $0.5 \leq z \leq 1$ In the formula (3a) above, the subscript p denotes the atomic ratio of Al. The value of p should be larger than the minimum value because Al is essential for hardness and oxidation resistance as in the case of the hard coating film of laminate type. However, with an excessively large value of p, the resulting hard coating film tends to assume the hexagonal structure (which is soft). Therefore, the atomic ratio of Al should be no smaller than 0.2, preferably no smaller than 0.25, more preferably no smaller than 0.3, and no larger than 0.7, preferably no larger than 0.65, more preferably no larger than 0.6.

In the formula (3a) above, the total atomic ratio (q+r) for Zr and Hf and the atomic ratio (1-p-q-r) for Cr range differently depending on the atomic ratio (p) for Al. If the atomic ratio (p) for Al is smaller than 0.5, it is necessary to add Zr and/Hf sufficiently to make up for the role of Al (for hardness and oxidation resistance). On the other hand, if the atomic ratio (p) for Al is no smaller than 0.5, the amount of Zr and/or Hf should be reduced because excess Zr and/or Hf changes the crystal structure into the hexagonal one. The atomic ratio (1-p-q-r) for Cr is determined according to the total atomic ratio (q+r) for Zr and Hf and the film characteristics required. The following rules apply to the total atomic ratio (q+r) for Zr and Hf and the atomic ratio (1-p-q-r) for Cr.

(1) If the atomic ratio (p) for Al is smaller than 0.5. The total atomic ratio (q+r) for Zr and Hf should be no smaller than 0.2, preferably no smaller than 0.23, more preferably no smaller than 0.25, and no larger than 0.5, preferably no larger than 0.47, more preferably no larger than 0.45.

The atomic ratio (1-p-q-r) for Cr should be no smaller than 0.05, preferably no smaller than 0.1, more preferably no smaller than 0.15.

(2) If the atomic ratio (p) for Al is no smaller than 0.5. The total atomic ratio (q+r) for Zr and Hf should be no smaller than 0.05, preferably no smaller than 0.08, more preferably no smaller than 0.1, and no larger than 0.25, preferably no larger tan 0.22, more preferably no larger than 0.2.

The atomic ratio (1-p-q-r) for Cr should be no smaller than 0.15, preferably no smaller than 0.15, more preferably no smaller than 0.2.

It is possible to add either or both of Zr and Hf regardless of the range of the atomic ratio (p) for Al. Therefore, either of q and r may be 0.

The atomic ratio (z) for N should be from 0.5 to 1, preferably from 0.8 to 1 regardless of the range of the atomic ratio (p) for Al. The atomic ratio (z) for N is limited to the specific range for the same reason as the hard coating film of laminate type.

The hard coating film of single-layer type may additionally contain Si and/or B in the same way as the hard coating film of laminate type mentioned above. The hard coating film of single-layer type containing Si and/or B has a composition represented by the formula (3b) below, in which B may form a carbonitride or B may also form a boride with Cr, Al, Zr, Hf, and Si.

$$(Cr_{(1-p-q-r-s-t)}Al_pZr_qHf_rSi_sB_t)(C_{(1-z)}N_z) \quad (3b)$$

where each subscript denotes the atomic ratio specified below, with either of q and r possibly being 0 and either of s and t possibly being 0.

when p<0.5:

$$0.2 \leq p < 0.5$$

$$0.2 \leq (q+r) \leq 0.5$$

$$0 < (s+t) \leq 0.2$$

$$0.05 \leq (1-p-q-r-s-t)$$

$$0.5 \leq z \leq 1$$

when p≥0.5:

$$0.5 \leq p \leq 0.7$$

$$0.05 \leq (q+r) \leq 0.25$$

$$0 < (s+t) \leq 0.2$$

$$0.15 \leq (1-p-q-r-s-t)$$

$$0.5 \leq z \leq 1$$

The atomic ratio (p) for Al, the total atomic ratio (q+r) for Zr and Hf, and the atomic ratio (z) for N are specified for the same reason as the formula (3a) above. The atomic ratio (1-p-q-r-s-t) for Cr is specified for the same reason as the atomic ratio (1-p-q-r) for Cr in the formula (3a) above. Either of s and t may be 0 for the same reason as b and c mentioned above.

The hard coating film of single-layer type may also be fabricated in the same way as the hard coating film of laminate type mentioned above. For example, it may be formed by chemical vapor deposition (CVD) or physical vapor deposition (PVD), particularly sputtering and ion plating (arc ion plating).

The hard coating film of single-layer type may be formed by PVD from the target represented by the formula (3c) or (3d) below which gives a (carbo)nitride layer having an C/N atomic ratio of from 0.5/0.5 to 0/1.

$$(Cr_{(1-p-q-r)}Al_pZr_qHf_r) \quad (3c)$$

$$(Cr_{(1-p-q-r-s-t)}Al_pZr_qHf_rSi_sB_t) \quad (3d)$$

where each subscript denotes the same values as defined for the formula (3a) and (3b) above.

The hard coating film of single-layer type should preferably have the cubit crystal structure as in the case of the hard coating film of laminate type mentioned above.

According to the present invention, the hard coating film (of both laminate type and single-layer type) should have a thickness no smaller than 1000 nm, preferably no smaller than 2000 nm, and no larger than 10000 nm, preferably no larger than 5000 nm.

The hard coating film of the present invention has greatly improved high-temperature characteristics because of the combination of (carbo)nitride of CrAl (represented by CrAlCN and CrAlN) and Zr and/or Hf.

EXAMPLES

The invention will be described in more detail with reference to the following examples, which are not intended to restrict the scope thereof. Various changes and modifications may be made in the present invention without departing from the spirit and scope thereof.

In the following experiment examples, the hard coating film was formed on three kinds of substrates specified below.
(1) Mirror-polished tip of cemented carbide (for examination of film composition, crystal structure, and film hardness)
(2) Ball-nose end mill of cemented carbide, 10 mm in diameter, two-blade, (for examination of wear width)
(3) Platinum foil, 30×5×0.1 mmt, (for examination of oxidation starting temperature)

The samples of hard coating film were tested for characteristic properties in the following manner.

<Composition of Hard Coating Film>

The composition (metallic elements) of the hard coating film was quantitatively analyzed by EDX (energy dispersive X-ray fluorescence spectroscopy) under the following conditions.
Accelerating voltage: 20 kV
WD (work distance): 15 mm
Measuring time (live): 60 seconds, with ZAF correction <Crystal Structure>

The samples of hard coating film were examined for X-ray diffraction peaks by X-ray diffractometry (θ-2θ method, CuK α line, at 40 kV and 40 mA) using an X-diffraction apparatus made by Rigaku Denki. The peak at 2θ=37.78° corresponds to the (111) plane of the cubic crystal, the peak at 2θ=43.9° corresponds to the (200) plane of the cubic crystal, and the peak at 2θ=63.8° corresponds to the (220) plane of the cubic crystal. The peak at 2θ=32°-33° corresponds to the (100) plane of the hexagonal crystal, the peak at 2θ=48°-50° corresponds to the (102) plane of the hexagonal crystal, and the peak at 2θ=57°-58° corresponds to the (110) plane of the hexagonal crystal. The intensity of each peak was measured, and the crystal structure index (X) was calculated according to the formula (4) below to determine the crystal structure of the hard coating film according to the following criteria.

$$X = \frac{IB(111) IB(200) + IB(220)}{IB(111) + IB(200) + IB(220) + IH(100) + IH(102) + IH(110)} \quad (4)$$

In the formula (4), IB(111), IB(200), and IB(220) denote the intensity of peak of each plane of the cubic crystals, and IH(100), IH(102), and IH(110) denote the intensity of peak of each plane of the hexagonal crystals. An index (X) larger than 0.9 represents the cubic crystal structure (indicated by B1 in the following tables). An index (X) no smaller than 0.1 and smaller than 0.9 represents the mixed crystal structure (indicated by B1+B4 in the following tables).

An index (X) smaller than 0.1 represents the hexagonal crystal structure (indicated by B4 in the following tables)

<Hardness>

The samples were tested for hardness by using a microvickers hardness meter, with a load of 0.25 N applied for 15 seconds.

<Oxidation Starting Temperature>

The coated platinum foil (obtained in the following experiment example) was heated in dry air at a rate of 5° C./min and examined for weight change by using a thermo-balance. The oxidation starting temperature was determined from the weight increase curve.

<Wear Width>

The hard film-coated end mill of cemented carbide (10 mm in diameter, two-flutes), which was obtained in the following experiment example, was used to cut SKD61 hardened steel (HRC50) under the following conditions. After cutting, the blade was observed under an optical microscope to measure the wear width at the boundary between rake face and flank face.
Cutting speed: 220 m/min
Feed: 0.05 mm/blade
Cutting depth: 4.5 mm 500° C. with a heater (not shown) and the substrate 51 was cleaned with argon introduced into the system, with the rotary plate 72 and the rotary table 71 turning. The film-forming gas (specified below) was introduced and the evaporation sources 25, 26, 27, and 28 were activated to form a hard coating film of laminate type. This procedure was continued until the hard coating film grew to a thickness of 3 μm.

Film-Forming Gas:
A mixture of Ar and $N_2$, or a mixture of Ar, $N_2$ and $CH_4$
Total pressure: 2.6 Pa
Partial pressure of reaction gas ($N_2$+$CH_4$): 1.3 Pa The thicknesses of the layers of a first kind and a second kind were controlled by adjusting electric power applied to the evaporation source and the period of rotation of the substrate 51.

The hard coating film thus obtained exhibited the physical properties shown in Table 1.

TABLE 1

| | Layer of a first kind | | | | | | Layer of a second kind | | | | | | Film | Oxidation start- | Wear |
|---|---|---|---|---|---|---|---|---|---|---|---|---|---|---|---|
| | Composition of film | | | | | | Composition of film | | | | | Crystal | No. of | hard-ness | ing temp. | width |
| No. | Cr (1 − a) | Al (a) | C (1 − x) | N (x) | Thickness (nm) | Crystal structure | Zr (1 − k) | Hf (k) | C (1 − y) | N (y) | Thickness (nm) | structure | layers | (HV) | (° C.) | (μm) |
| i | | $Ti_{0.5}Al_{0.5}N$ | | | 3000 | B1 | | | | | — | | 1 | 2500 | 850 | * |
| ii | | TiCN | | | 3000 | B1 | | | | | — | | 1 | 2800 | 650 | ** |
| iii | | $Cr_{0.35}Al_{0.65}N$ | | | 3000 | B1 | | | | | — | | 1 | 2900 | 1000 | 100 |
| 1 | 1 | 0 | 0 | 1 | 50 | B1 | 1 | 0 | 0 | 1 | 20 | B1 | 42 | 2800 | 650 | 105 |
| 2 | 0.85 | 0.15 | 0 | 1 | 50 | B1 | 1 | 0 | 0 | 1 | 20 | B1 | 42 | 2850 | 1000 | 100 |
| 3 | 0 | 1 | 0 | 1 | 50 | B4 | 1 | 0 | 0 | 1 | 20 | B1 | 42 | 2700 | 1200 | 120 |
| 4 | 0.37 | 0.63 | 0.4 | 0.6 | 50 | B1 | 0.8 | 0.2 | 0.3 | 0.7 | 20 | B1 | 42 | 3250 | 1000 | 55 |
| 5 | 0.37 | 0.63 | 0.7 | 0.3 | 50 | B1 | 0.8 | 0.2 | 0.1 | 0.9 | 20 | B1 | 42 | 2850 | 950 | 95 |
| 6 | 0.37 | 0.63 | 0.75 | 0.25 | 50 | B1 | 0.8 | 0.2 | 0.25 | 0.75 | 20 | B1 | 42 | 2700 | 900 | 85 |
| 7 | 0.37 | 0.63 | 0 | 1 | 0.5 | B1 | 0.85 | 0.15 | 0 | 1 | 30 | B1 | 98 | 2900 | 850 | 90 |
| 8 | 0.37 | 0.63 | 0 | 1 | 30 | B1 | 0.8 | 0.2 | 0.1 | 0.9 | 0.2 | B1 | 99 | 2900 | 1000 | 100 |
| 9 | 0.4 | 0.6 | 0 | 1 | 100 | B1 | 0.9 | 0.1 | 0 | 1 | 130 | B1 | 13 | 2900 | 1050 | 85 |
| 10 | 0.4 | 0.6 | 0 | 1 | 200 | B1 | 0.85 | 0.15 | 0 | 1 | 50 | B1 | 12 | 2800 | 1000 | 90 |
| 11 | 0.7 | 0.3 | 0 | 1 | 50 | B1 | 1 | 0 | 0 | 1 | 20 | B1 | 42 | 3000 | 1050 | 65 |
| 12 | 0.5 | 0.5 | 0 | 1 | 50 | B1 | 1 | 0 | 0 | 1 | 20 | B1 | 42 | 3200 | 1100 | 45 |
| 13 | 0.34 | 0.66 | 0 | 1 | 50 | B1 | 1 | 0 | 0 | 1 | 20 | B1 | 42 | 3200 | 1150 | 30 |
| 14 | 0.2 | 0.8 | 0 | 1 | 50 | B4 | 1 | 0 | 0 | 1 | 20 | B1 | 42 | 2950 | 1200 | 58 |
| 15 | 0.4 | 0.6 | 0 | 1 | 50 | B1 | 0.8 | 0.2 | 0 | 1 | 20 | B1 | 42 | 3150 | 1200 | 40 |
| 16 | 0.4 | 0.6 | 0 | 1 | 50 | B1 | 0.55 | 0.45 | 0 | 1 | 20 | B1 | 42 | 3100 | 1200 | 37 |
| 17 | 0.4 | 0.6 | 0 | 1 | 50 | B1 | 0.25 | 0.75 | 0 | 1 | 20 | B1 | 42 | 3150 | 1150 | 41 |
| 18 | 0.4 | 0.6 | 0 | 1 | 50 | B1 | 0.05 | 0.95 | 0 | 1 | 20 | B1 | 42 | 3200 | 1200 | 43 |
| 19 | 0.37 | 0.63 | 0.2 | 0.8 | 50 | B1 | 0.8 | 0.2 | 0.3 | 0.7 | 20 | B1 | 42 | 3250 | 1050 | 49 |
| 20 | 0.4 | 0.6 | 0.1 | 0.9 | 5 | B1 | 1 | 0 | 0 | 1 | 10 | B1 | 200 | 3100 | 1100 | 45 |
| 21 | 0.37 | 0.65 | 0 | 1 | 20 | B1 | 0.4 | 0.6 | 0 | 1 | 25 | B1 | 66 | 3300 | 1200 | 40 |
| 22 | 0.35 | 0.65 | 0 | 1 | 25 | B1 | 0.7 | 0.3 | 0 | 1 | 35 | B1 | 50 | 3250 | 1150 | 38 |
| 23 | 0.33 | 0.67 | 0 | 1 | 30 | B1 | 1 | 0 | 0 | 1 | 15 | B1 | 66 | 3200 | 1100 | 36 |

* died after 50 m,
** died after 20 m.

Axial cut: 1 mm
Others: dry cutting, air blowing

Experiment Example 1

The apparatus shown in FIG. 3 was used in which the arc evaporation sources 25 and 26 are provided with targets of Cr and Al (whose composition is almost identical with that of the first layer shown in Table 1) and the sputtering evaporation sources 27 and 28 are provided with targets of Zr and Hf (whose composition is almost identical with that of the second layer shown in Table 1). A substrate 51 (tip, ball-nose end mill, or platinum foil), which had been degreased and cleaned with ethanol, was attached to the rotary table 71, and the chamber 8 was evacuated. The system was heated to about The samples Nos. 11 to 23 in Table 1 correspond to the hard coating film of laminate type according to the present invention. They are superior to the samples Nos. i to iii of conventional hard coating film (shown in Table 1) in hardness, oxidation starting temperature, and wear width.

Experiment Example 2

The same procedure as Experiment Example 1 was repeated except that the arc evaporation sources 25 and 26 were provided with targets of Cr.Al.Si.B (having almost the same composition as the layer of a first kind shown in Table 2) and the sputtering evaporation sources 27 and 28 were provided with targets of Zr.Hf.Si.B (having almost the same composition as the layer of a second kind shown in Table 1).

The hard coating film thus obtained exhibited the physical properties shown in Table 2.

TABLE 2

| | Layer of a first kind | | | | | | | | Layer of a second kind | |
| | Composition of film | | | | | | | | Composition of film | |
| No. | Cr $(1-a-b-c)$ | Al $(a)$ | Si $(b)$ | B $(c)$ | C $(1-x)$ | N $(x)$ | ThickNess (nm) | Crystal Structure | Zr $(1-k-m-n)$ | Hf $(k)$ |
|---|---|---|---|---|---|---|---|---|---|---|
| i | | Ti$_{0.5}$Al$_{0.5}$N | | | | | 3000 | B1 | — | |
| ii | | TiCN | | | | | 3000 | B1 | — | |
| iii | | Cr$_{0.35}$Al$_{0.65}$N | | | | | 3000 | B1 | — | |
| 1 | 0.4 | 0.35 | 0.25 | 0 | 0 | 1 | 40 | B4 | 1 | 0 |
| 2 | 0.4 | 0.54 | 0.06 | 0 | 0 | 1 | 40 | B1 | 0 | 0.73 |
| 3 | 0.34 | 0.66 | 0 | 0 | 0 | 1 | 40 | B1 | 1 | 0 |
| 4 | 0.4 | 0.57 | 0.03 | 0 | 0 | 1 | 40 | B1 | 1 | 0 |
| 5 | 0.4 | 0.54 | 0.06 | 0 | 0 | 1 | 40 | B1 | 1 | 0 |
| 6 | 0.4 | 0.45 | 0.15 | 0 | 0 | 1 | 40 | B1 + B4 | 1 | 0 |
| 7 | 0.4 | 0.54 | 0.06 | 0 | 0 | 1 | 40 | B1 | 0.96 | 0 |
| 8 | 0.4 | 0.54 | 0.06 | 0 | 0 | 1 | 40 | B1 | 0.5 | 0.42 |
| 9 | 0.4 | 0.54 | 0.06 | 0 | 0 | 1 | 40 | B1 | 0.85 | 0 |

| | Layer of a second kind Composition of film | | | | | | | Film | Oxidation starting | Wear |
| No. | Si $(m)$ | B $(n)$ | C $(1-y)$ | N $(y)$ | ThickNess (nm) | Crystal Structure | No. of layers | hardness (HV) | temp. (° C.) | width (μm) |
|---|---|---|---|---|---|---|---|---|---|---|
| i | | | | — | | | 1 | 2500 | 850 | * |
| ii | | | | — | | | 1 | 2800 | 650 | ** |
| iii | | | | — | | | 1 | 2900 | 1000 | 100 |
| 1 | 0 | 0 | 0 | 1 | 20 | B1 | 50 | 2900 | 1300 | 68 |
| 2 | 0 | 0.27 | 0 | 1 | 20 | B4 | 50 | 2800 | 1100 | 78 |
| 3 | 0 | 0 | 0 | 1 | 20 | B1 | 50 | 3200 | 1150 | 30 |
| 4 | 0 | 0 | 0 | 1 | 20 | B1 | 50 | 3200 | 1250 | 25 |
| 5 | 0 | 0 | 0 | 1 | 20 | B1 | 50 | 3250 | 1250 | 23 |
| 6 | 0 | 0 | 0 | 1 | 20 | B1 | 50 | 3100 | 1300 | 35 |
| 7 | 0 | 0.04 | 0 | 1 | 30 | B1 | 50 | 3150 | 1200 | 35 |
| 8 | 0 | 0.08 | 0 | 1 | 20 | B1 | 50 | 3250 | 1250 | 37 |
| 9 | 0 | 0.15 | 0 | 1 | 20 | B1 | 50 | 3250 | 1250 | 41 |

* died after 50 m,
** died after 20 m.

The samples Nos. 3 to 9 in Table 2 correspond to the hard coating film of laminate type according to the present invention. They are superior to the samples Nos. i to iii of conventional hard coating film (shown in Table 1) in hardness, oxidation starting temperature, and wear width.

Experiment Example 3

The same procedure as Experiment Example 1 was repeated except that the arc evaporation sources 25, 26, 27, and 28 were provided with targets of Cr.Al.Zr.Hf (having almost the same composition as shown in Table 3). (Sputtering evaporation sources were not used.) Deposition was carried out by using N$_2$ gas (having a total pressure of 4 Pa) or a mixture gas of N$_2$ and CH$_4$ (having a partial pressures of 2.7 Pa and 1.3 Pa, respectively for N$_2$ and CH$_4$, and a total pressure of 4 Pa).

The hard coating film thus obtained exhibited the physical properties shown in Table 3.

TABLE 3

| | Composition of film | | | | | | | Film | Oxidation | Wear |
| No. | Cr $(1-p-q-r)$ | Al $(p)$ | Zr $(q)$ | Hf $(r)$ | C $(1-z)$ | N $(z)$ | Crystal structure | hardness (HV) | starting temp. (° C.) | width (μm) |
|---|---|---|---|---|---|---|---|---|---|---|
| i | | Ti$_{0.5}$Al$_{0.5}$N | | | | | B1 | 2500 | 850 | * |
| ii | | TiCN | | | | | B1 | 2800 | 650 | ** |
| iii | | Cr$_{0.35}$Al$_{0.65}$N | | | | | B1 | 2900 | 1000 | 100 |
| 1 | 0.8 | 0 | 0.2 | 0 | 0 | 1 | B1 | 2700 | 650 | 105 |
| 2 | 0.75 | 0.1 | 0.15 | 0 | 0 | 1 | B1 | 2750 | 700 | 98 |
| 3 | 0.4 | 0.35 | 0.05 | 0.2 | 0 | 1 | B1 | 3000 | 1050 | 65 |
| 4 | 0.2 | 0.35 | 0.2 | 0.25 | 0 | 1 | B1 | 3200 | 1100 | 45 |
| 5 | 0.3 | 0.4 | 0.3 | 0 | 0 | 1 | B1 | 3100 | 1150 | 47 |
| 6 | 0 | 0.5 | 0 | 0.5 | 0 | 1 | B1 + B4 | 2950 | 850 | 96 |
| 7 | 0.05 | 0.65 | 0.2 | 0.1 | 0 | 1 | B1 + B4 | 2800 | 950 | 80 |
| 8 | 0.05 | 0.55 | 0.4 | 0 | 0 | 1 | B1 + B4 | 2750 | 900 | 90 |

TABLE 3-continued

| No. | Composition of film Cr $(1-p-q-r)$ | Al $(p)$ | Zr $(q)$ | Hf $(r)$ | C $(1-z)$ | N $(z)$ | Crystal structure | Film hardness (HV) | Oxidation starting temp. (°C.) | Wear width (μm) |
|---|---|---|---|---|---|---|---|---|---|---|
| 9 | 0.15 | 0.8 | 0 | 0.05 | 0 | 1 | B1 + B4 | 2800 | 1100 | 100 |
| 10 | 0.2 | 0.65 | 0.15 | 0 | 0 | 1 | B1 | 3200 | 1100 | 45 |
| 11 | 0.25 | 0.6 | 0 | 0.15 | 0.2 | 0.8 | B1 | 3150 | 1150 | 50 |

* died after 50 m,
** died after 20 m.

The samples Nos. 3 to 5 and Nos. 10 and 11 in Table 3 correspond to the hard coating film according to the present invention. They are superior to the samples Nos. i to iii of conventional hard coating film (shown in Table 3) in hardness, oxidation starting temperature, and wear width.

Experiment Example 4

The same procedure as Experiment Example 3 was repeated except that the evaporation source was provided with a target of Cr.Al.Zr.Hf.Si.B (having almost the same composition as shown in Table 4).

The hard coating film thus obtained exhibited the physical properties shown in Table 4.

TABLE 4

| No. | Film composition Cr $(1-p-q-r-s-t)$ | Al $(p)$ | Zr $(q)$ | Hf $(r)$ | Si $(s)$ | B $(t)$ | C $(1-z)$ | N $(z)$ | Crystal structure | Film hardness (HV) | Oxidation starting temp. (°C.) | Wear width (μm) |
|---|---|---|---|---|---|---|---|---|---|---|---|---|
| i | | | $Ti_{0.5}Al_{0.5}N$ | | | | | | B1 | 2500 | 850 | * |
| ii | | | TiCN | | | | | | B1 | 2800 | 850 | ** |
| iii | | | $Cr_{0.35}Al_{0.65}N$ | | | | | | B1 | 2900 | 1000 | 100 |
| 1 | 0.12 | 0.3 | 0.1 | 0.2 | 0 | 0.28 | 0 | 1 | B1 + B4 | 2900 | 1200 | 78 |
| 2 | 0.2 | 0.35 | 0.16 | 0.25 | 0 | 0.04 | 0 | 1 | B1 | 3200 | 1100 | 45 |
| 3 | 0.15 | 0.35 | 0.15 | 0.25 | 0 | 0.1 | 0 | 1 | B1 | 3250 | 1150 | 42 |
| 4 | 0.15 | 0.35 | 0.1 | 0.25 | 0 | 0.15 | 0 | 1 | B1 | 3200 | 1200 | 48 |
| 5 | 0.32 | 0.4 | 0.15 | 0.05 | 0.03 | 0.05 | 0.1 | 0.9 | B1 | 3250 | 1250 | 37 |
| 6 | 0.13 | 0.5 | 0.1 | 0 | 0.27 | 0 | 0 | 1 | B1 + B4 | 2900 | 1300 | 67 |
| 7 | 0.2 | 0.6 | 0.15 | 0 | 0.05 | 0 | 0 | 1 | B1 | 3200 | 1200 | 35 |
| 8 | 0.2 | 0.6 | 0.12 | 0 | 0.08 | 0 | 0 | 1 | B1 | 3250 | 1300 | 32 |

* died after 50 m,
** died after 20 m.

The samples Nos. 2 to 5 and Nos. 7 and 8 in Table 4 correspond to the hard coating film according to the present invention. They are superior to the samples Nos. i to iii of conventional hard coating film (shown in Table 4) in hardness, oxidation starting temperature, and wear width.

The hard coating film according to the present invention excels in hardness, oxidation starting temperature, wear width (for high-speed cutting in a dry state), and high-temperature characteristics. It is suitable for coating of cutting tools and dies (such as high speed tool steel (SKH51, SKD11, SKD61, cemented carbide, and other ferrous substrates). Coated substrates are useful as cutting tools and dies having outstanding hardness and oxidation resistance.

What is claimed is:

1. A hard coating film which has a composition represented by the formula (3a) below:

$$(Cr_{(1-p-q-r)}Al_pZr_qHf_r)(C_{(1-z)}N_z) \quad (3a),$$

where each subscript denotes the atomic ratio specified below, with either of q and r possibly being 0, and where
when p<0.5:

$$0.2 \leq p < 0.5,$$

$$0.2 \leq (q+r) \leq 0.5,$$

$$0.05 \leq (1-p-q-r), \text{ and}$$

$$0.5 \leq z \leq 1; \text{ and}$$

when p≧0.5:

$$0.5 \leq p \leq 0.7,$$

$$0.05 \leq (q+r) \leq 0.25,$$

$$0.15 \leq (1-p-q-r), \text{ and}$$

$$0.5 \leq z \leq 1.$$

2. A hard coating film which has a composition represented by the formula (3b) below:

$$(Cr_{(1-p-q-r-s-t)}Al_pZr_qHf_rSi_sB_t)(C_{(1-z)}N_z) \quad (3b),$$

where each subscript denotes the atomic ratio specified below, with either of q and r possibly being 0 and either of s and t possibly being 0, and where
when p<0.5:

$$0.2 \leq p < 0.5,$$

$$0.2 \leq (q+r) \leq 0.5,$$

$$0 < (s+t) \leq 0.2,$$

$$0.05 \leq (1-p-q-r-s-t), \text{ and}$$

$$0.5 \leq z \leq 1; \text{ and}$$

when p≥0.5:

$0.5 \leq p \leq 0.7$, $0.05 \leq (q+r) \leq 0.25$, $0 < (s+t) \leq 0.2$, $0.15 \leq (1-p-q-r-s-t)$, and $0.5 \leq z \leq 1$.

3. A hard coating film which is obtained by forming a layer of nitride or carbonitride (C/N atomic ratio being from 0.5/0.5 to 0/1) by ion-plating or sputtering with a target represented by the formula (3c) below:

  (3c), $(Cr_{(1-p-q-r)}Al_pZr_qHf_r)$ where each subscript denotes the atomic ratio specified below, with either of q and r possibly being 0, and where when p<0.5:

$0.2 \leq p < 0.5$, $0.2 \leq (q+r) \leq 0.5$, and $0.05 \leq (1-p-q-r)$; and when p≥0.5:

$0.5 \leq p \leq 0.7$, $0.05 \leq (q+r) \leq 0.25$, and $0.15 \leq (1-p-q-r)$.

4. A hard coating film which is obtained by forming a layer of nitride or carbonitride (C/N atomic ratio being from 0.5/0.5 to 0/1) by ion-plating or sputtering with a target represented by the formula (3d) below:

  (3d), $(Cr_{(1-p-q-r-s-t)}Al_pZr_qHf_rSi_sB_t)$ where each subscript denotes the atomic ratio specified below, with either of q and r possibly being 0 and either of s and t possibly being 0, and where when p<0.5:

$0.2 \leq p < 0.5$, $0.2 \leq (q+r) \leq 0.5$, $0 < (s+t) \leq 0.2$, and $0.05 \leq (1-p-q-r-s-t)$; and when p≥0.5:

$0.5 \leq p \leq 0.7$, $0.05 \leq (q+r) \leq 0.25$, $0 < (s+t) \leq 0.2$, and $0.15 \leq (1-p-q-r-s-t)$.

5. The hard coating film according to claim 1, which possesses the cubic crystal structure.

6. The hard coating film according to claim 2, which possesses the cubic crystal structure.

7. The hard coating film according to claim 3, which possesses the cubic crystal structure.

8. The hard coating film according to claim 4, which possesses the cubic crystal structure.

9. The hard coating film according to claim 1, which has a thickness no smaller than 1000 nm.

10. The hard coating film according to claim 2, which has a thickness no smaller than 1000 nm.

11. The hard coating film according to claim 3, which has a thickness no smaller than 1000 nm.

12. The hard coating film according to claim 4, which has a thickness no smaller than 1000 nm.

13. The hard coating film according to claim 5, which has a thickness no smaller than 1000 nm.

14. The hard coating film according to claim 6, which has a thickness no smaller than 1000 nm.

15. The hard coating film according to claim 7, which has a thickness no smaller than 1000 nm.

16. The hard coating film according to claim 8, which has a thickness no smaller than 1000 nm.

17. A method of making a hard coating film, the method comprising depositing onto a substrate by chemical vapor deposition or physical vapor deposition the hard coating film of claim 1.

18. A method of making a hard coating film, the method comprising depositing onto a substrate by chemical vapor deposition or physical vapor deposition the hard coating film of claim 2.

19. A method of making a hard coating film, the method comprising depositing onto a substrate by ion-plating or sputtering the hard coating film of claim 3.

20. A method of making a hard coating film, the method comprising depositing onto a substrate by ion-plating or sputtering the hard coating film of claim 4.

* * * * *